(12) United States Patent
Laufer et al.

(10) Patent No.: US 12,321,105 B2
(45) Date of Patent: Jun. 3, 2025

(54) PROJECTION EXPOSURE APPARATUS FOR SEMICONDUCTOR LITHOGRAPHY

(71) Applicant: Carl Zeiss SMT GmbH, Oberkochen (DE)

(72) Inventors: Timo Laufer, Stuttgart (DE); Michael Stolz, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 81 days.

(21) Appl. No.: 17/932,423

(22) Filed: Sep. 15, 2022

(65) Prior Publication Data

US 2023/0010705 A1    Jan. 12, 2023

Related U.S. Application Data

(63) Continuation of application No. PCT/EP2020/087076, filed on Dec. 18, 2020.

(30) Foreign Application Priority Data

Mar. 24, 2020   (DE) .......................... 102020203753.1

(51) Int. Cl.
  *G03F 7/00*   (2006.01)
  *G01J 5/59*   (2022.01)
  *G02B 27/28*  (2006.01)

(52) U.S. Cl.
  CPC .............. *G03F 7/7085* (2013.01); *G01J 5/59* (2022.01); *G02B 27/281* (2013.01); *G02B 27/288* (2013.01)

(58) Field of Classification Search
  CPC ...... G03F 7/70891; G03F 7/7085; G01J 5/59; G01J 5/804
  See application file for complete search history.

(56) References Cited

U.S. PATENT DOCUMENTS

| | | | |
|---|---|---|---|
| 4,020,695 A | * | 5/1977 | Roney ....................... G01J 5/06 374/126 |
| 4,298,247 A | | 11/1981 | Michelet et al. |
| 5,390,228 A | * | 2/1995 | Niibe ................... G03F 7/70008 359/846 |
| 5,710,431 A | | 1/1998 | Spindler |
| 6,798,188 B2 | | 9/2004 | Dathe et al. |
| 6,821,682 B1 | | 11/2004 | Stearns et al. |

(Continued)

FOREIGN PATENT DOCUMENTS

| | | |
|---|---|---|
| DE | 10239859 B3 | 4/2004 |
| DE | 10 2005 004 460 A1 | 8/2006 |

(Continued)

OTHER PUBLICATIONS

Machine translation of JP-2002303551-A (Year: 2002).*

(Continued)

*Primary Examiner* — Steven H Whitesell
(74) *Attorney, Agent, or Firm* — Fish & Richardson P.C.

(57) ABSTRACT

A projection exposure apparatus for semiconductor lithography comprises an optical element and a temperature recording device for detecting a temperature on a surface of the optical element via electromagnetic radiation emanating from the surface of the optical element. The temperature recording device can comprise a filter for filtering the electromagnetic radiation.

20 Claims, 5 Drawing Sheets

(56) References Cited

U.S. PATENT DOCUMENTS

| | | | |
|---|---|---|---|
| 6,844,272 | B2 | 1/2005 | Taylor et al. |
| 6,849,859 | B2 | 2/2005 | Folta et al. |
| 6,898,011 | B2 | 5/2005 | Kandaka et al. |
| 7,083,290 | B2 | 8/2006 | Masaki et al. |
| 7,155,363 | B1 | 12/2006 | Rosenthal |
| 7,189,655 | B2 | 3/2007 | Takaoka |
| 11,415,892 | B2 | 8/2022 | Kaes et al. |
| 2001/0006412 | A1 | 7/2001 | Karl-Heinz |
| 2003/0006214 | A1 | 1/2003 | Stearns et al. |
| 2003/0058986 | A1 | 3/2003 | Oshino et al. |
| 2003/0081722 | A1 | 5/2003 | Kandaka et al. |
| 2004/0051984 | A1 | 3/2004 | Oshino et al. |
| 2004/0061868 | A1 | 4/2004 | Chapman et al. |
| 2004/0094724 | A1 | 5/2004 | Schuurmans |
| 2004/0227102 | A1* | 11/2004 | Kurt ............... G01N 21/95684 250/491.1 |
| 2006/0234458 | A1 | 10/2006 | Jennings et al. |
| 2007/0056940 | A1* | 3/2007 | Salem ............... G01J 5/53 219/121.83 |
| 2008/0210888 | A1 | 9/2008 | Inoue |
| 2010/0014060 | A1 | 1/2010 | Lexmond et al. |
| 2010/0068632 | A1 | 3/2010 | Motoshi et al. |
| 2010/0171917 | A1 | 6/2010 | Meltzer et al. |
| 2010/0292950 | A1 | 11/2010 | Iuchi |
| 2012/0154772 | A1 | 6/2012 | Laufer |
| 2013/0148105 | A1 | 6/2013 | Goeppert |
| 2013/0176544 | A1 | 7/2013 | Hauf et al. |
| 2014/0307308 | A1 | 10/2014 | Weiss et al. |
| 2016/0091798 | A1 | 3/2016 | Pauls et al. |
| 2016/0146670 | A1* | 5/2016 | Chlebowski ......... G01J 5/0003 250/341.6 |
| 2017/0343424 | A1* | 11/2017 | Moffitt ............... G01K 11/125 |

FOREIGN PATENT DOCUMENTS

| | | |
|---|---|---|
| DE | 102007051291 A1 | 4/2009 |
| DE | 10 2011 079 484 A1 | 1/2013 |
| DE | 102011084117 A1 | 4/2013 |
| DE | 102013214008 A1 | 1/2015 |
| DE | 102015224281 A1 | 9/2016 |
| DE | 102017217121 A1 | 3/2019 |
| DE | 10 2018 212 400 A1 | 1/2020 |
| DE | 102018211596 A1 | 1/2020 |
| EP | 1521155 A2 | 4/2005 |
| JP | 2002303551 A * | 10/2002 |
| JP | 2008016823 | 1/2008 |
| TW | 201835676 A | 10/2018 |
| WO | WO 2011020655 | 2/2011 |
| WO | WO 2014/001071 A2 | 1/2014 |

OTHER PUBLICATIONS

International Search Report and Written Opinion for corresponding PCT Appl No. PCT/EP2020/087076, dated Mar. 23, 2021.

Simova et al., "Polarization splitter/combiner in high index contrast Bragg reflector waveguides," Optical Express, vol. 11, No. 25, Dec. 15, 2003, p. 3425.

German Office Action, with translation thereof, for corresponding Appl No. DE 10 2020 203 753.1, dated Sep. 22, 2020.

Yamada et al., "In situ Si Wafer Surface temperature Measurement during Flash Lamp Annealing", Japanese Journal of Applied Physics, Japan Society of Applied Physics, JP, vol. 49, No. 4, Apr. 20, 2010, 3 pages.

Taiwanese Office Action and Search Report, with translation thereof, for corresponding Appl No. TW 110110441, dated Oct. 14, 2024.

Korean Office Action, with translation thereof, for corresponding KR Application No. 10-2022-7036379, dated Dec. 10, 2024.

Taiwanese Office Action and Search Report, with translation thereof, for corresponding Appl No. TW 110110441, dated Jan. 15, 2025.

* cited by examiner

PROJECTION EXPOSURE APPARATUS FOR SEMICONDUCTOR LITHOGRAPHY

CROSS-REFERENCE TO RELATED APPLICATIONS

The present application is a continuation of, and claims benefit under 35 USC 120 to, international application PCT/EP2020/087076, filed Dec. 18, 2020, which claims benefit under 35 USC 119 of German Application No. 10 2020 203 753.1, filed Mar. 24, 2020. The entire disclosure of these applications are incorporated by reference herein.

FIELD

The disclosure relates to a projection exposure apparatus for semiconductor lithography.

BACKGROUND

Projection exposure apparatuses for semiconductor lithography are used for producing extremely fine structures, for example on semiconductor components or other microstructured component parts. The operating principle of the apparatuses is based on the production of very fine structures down to the nanometer range by way of generally reducing imaging of structures on a mask, a so-called reticle, on an element to be structured, a so-called wafer, that is provided with photosensitive material. The minimum dimensions of the structures produced are generally directly dependent on the wavelength of the light used. Recently, light sources having an emission wavelength in the range of a few nano-metres, for example between 1 nm and 120 nm, such as in the region of 13.5 nm, have increasingly been used. The wavelength range around 13.5 nm is also referred to as the EUV range. Apart from EUV systems, the microstructured component parts are also produced using commercially established DUV systems, which have a wavelength of between 100 nm and 400 nm, for example 193 nm. As a result of introducing the EUV range, and hence the possibility of being able to produce even smaller structures, there has also been a further increase in the demands in respect of the optical correction of the DUV systems with a wavelength of 193 nm. Additionally, there is generally an increase in the throughput of each new generation of projection exposure apparatuses, independently of the wavelength, so as to increase the profitability; this typically leads to a greater thermal load and hence to more imaging aberrations caused by the heat. To correct the imaging aberrations, use can be made of optical assemblies, such as manipulators, for example, which alter the position and alignment of the optical elements or else influence the imaging properties of the optical elements, such as mirrors, by deforming the optical effective surfaces. In this case, an optical effective surface should be understood to mean that part of a surface of an optical element which is impinged on by used light for the imaging of structures. Alternatively, the optical elements of the optical assemblies which are embodied as mirrors can be temperature-regulated via direct water cooling. For this purpose, the mirrors comprise cutouts which are embodied as cooling channels and which are arranged in one or more planes at different distances from the optical effective surface and through which temperature-regulated water flows. An accurate measurement of the surface temperature is desirable for both approaches.

The patent application US20040051984A1 discloses a projection exposure apparatus comprising an infrared camera, which detects the temperature of the surface of a mirror. However, the infrared camera detects not only the radiation emitted from the surface of the mirror but also the radiation of the thermal radiation reflected from the surroundings at the mirror surface and, as a result, a differential between the temperature of the mirror surface and the surroundings cannot be determined with a sufficient accuracy.

SUMMARY

The present disclosure seeks to provide an improved device.

In an aspect, a projection exposure apparatus for semiconductor lithography according to the disclosure comprises at least one optical element and at least one temperature recording device for detecting a temperature on a surface of the optical element via the thermal electromagnetic radiation emanating from the surface of the optical element. According to the disclosure the device can comprise a filter for filtering the electromagnetic radiation.

In this case, a filter can be arranged between the temperature recording device and the optical element. By virtue of the fact that the radiation used for detecting the temperature is filtered before it reaches the temperature recording device, disturbing radiation that cannot be used for determining the temperature of the surface or would corrupt the measurement can be masked out, with the result that the accuracy of the temperature measurement is improved.

For example, the filter can be a polarisation filter. This makes use of the fact that a predominant proportion of the disturbing radiation does not originally originate from the surface of the optical element, but rather emanates from other constituent parts of the projection exposure apparatus and has only been reflected from the surface of the optical element in the direction of the temperature recording device. A partial or complete polarisation occurs, however, when electromagnetic radiation is reflected at interfaces, that is to say that portions of radiation that are polarised perpendicularly to the plane of incidence of the radiation are predominantly reflected by the surface of the optical element. The interface thus acts in the manner of a polariser in a polariser/analyser arrangement. The portions of radiation mentioned can then be filtered out by the polarisation filter arranged upstream of the temperature recording device, the polarisation filter acting as an analyser in this case. As a result, the radiation emitted by the surroundings, that is to say for example the housing surrounding the optical element, and reflected by the optical effective surface can be partly or completely suppressed, such that primarily the unpolarised radiation emitted by the optical effective surface itself or considerable portions of this radiation impinge(s) on the temperature recording device and can be detected by the latter.

In this case, it may be desirable for the temperature recording device to be arranged in such a way that the radiation reflected at the surface and incident on the temperature recording device is reflected at an angle close to the Brewster angle. The Brewster angle is the angle at which the reflected light, when radiation is incident on an interface between two media, is polarised maximally perpendicularly to the plane of incidence of the radiation. The Brewster angle is dependent on the refractive indices of the two media and the frequency of the electromagnetic radiation and is 55.59° for the interface between air and $SiO_2$, for example.

Furthermore, the polarisation filter can be a rotating polarisation filter. As a result, a known frequency can be impressed on the intensity of the reflected, polarised thermal radiation, the intensity being detected by the temperature recording device. In this way, the signal portion attributed to reflected (and unwanted) radiation can relatively easily be identified by the temperature recording device and is taken into account in the determination of the surface temperature of the optical element.

To improve the measurement accuracy further, the device can comprise a lock-in amplifier. A lock-in amplifier amplifies a weak electrical signal which is modulated with a known frequency and phase. In the case of a projection exposure apparatus, the radiation used for imaging a structure onto a wafer is usually clocked. In this regard, by way of example, an optical element embodied as a mirror can be irradiated with a clocking of 0.2 second radiation on and 0.5 second radiation off. In the case described, this can have the effect that the bulk material of the mirror reaches a temperature of approximately 60° Celsius, but the topmost layers of the mirror reach a surface temperature of between e.g. approximately 60° Celsius and 120° Celsius which changes cyclically over time. This cyclically hot topmost layer is very thin and its proportion of the total thermal radiation is likewise small as a result; it may correspond for example only to 0.1% of the total thermal radiation of the mirror. However, exactly this clocked signature of the radiation can be amplified, detected and determined with the aid of the lock-in technique.

The lock-in technique can also make it possible to dispense with the use of a filter. The same applies to the variants described below. Each of these variants by itself or else in combination with one or more other variants can also be realised without the use of a filter.

Furthermore, at least one element of the projection exposure apparatus whose radiation impinges on the temperature recording device as a result of reflection at the optical element can be configured to be temperature-regulated. What is achieved thereby is that radiation which reaches the temperature recording device and which does not originate directly from the surface—of interest for the measurement—of the optical element can be emitted at least by an element whose temperature and thus whose thermal radiation can be controlled. Using the measure according to the disclosure, the error contribution of the thermal radiation reflected on the surface of the optical element can be relatively well managed.

Additionally or alternatively, the surface of the optical element can comprise a coating having an emissivity for the wavelength range detected by the temperature recording device of 0.1, for example greater than 0.4, such as greater than 0.95. The surfaces of the optical element usually have coatings for reflecting electromagnetic radiation having a wavelength of between 1 nm and 400 nm. An additional layer, which does not reduce the reflectivity in the range of 1 μm to 400 μm and can increase the emissivity of the surface for a wavelength of e.g. 1 μm to 15 μm to the values described further above, can therefore be formed on the surface. It goes without saying that it is also conceivable to increase the emissivity for wavelengths outside the range mentioned.

In some embodiments, at least one element of the projection exposure apparatus whose radiation impinges on the temperature recording device as a result of reflection at the optical element can be embodied in such a way that the emissivity for the wavelength range detected by the temperature recording device is greater than 0.4, such as greater than 0.7, for example greater than 0.95. The element can likewise be coated, wherein a functional layer, as in the case of the optical element for semiconductor lithography, does not have to be taken into account here. In this case, the element can act like a beam trap for thermal radiation emanating from the surroundings since the high emissivity mentioned is also accompanied by a high absorbance.

Furthermore, the temperature recording device can comprise an IR camera.

For example, the temperature recording device can be designed to detect a partial region of the surface of the optical element. By limiting the field of view of the camera, the radiation detected by the IR camera as a result of reflection at the optical element, which radiation represents disturbing parasitic radiation for the detection of the surface temperature of the optical effective surface, can be reduced to a minimum. In the case of a plurality of cameras, the cameras can detect different partial regions of the optical element.

Furthermore, the temperature recording device can be configured to detect in a scanning fashion the radiation emitted or reflected by the optical element.

For example, the temperature recording device can be movable in such a way that the radiation emitted or reflected by the optical element is detected in a scanning fashion.

It may also be desirable for an optical unit of the temperature recording device to be moved in such a way that the radiation emitted or reflected by the optical element is detected in a scanning fashion. The scanning detection of the radiation can allow for the use of infrared cameras having a relatively narrow field of view. The scanning movement can also be such that the angle of the detected radiation is always close to the Brewster angle even in the case of concave or convex surfaces of the optical element. In this context, close to the Brewster angle is taken to mean that the angle is reached with a deviation of e.g. a maximum of 10°.

Exemplary embodiments and variants of the disclosure are explained in more detail below with reference to the drawing.

EXEMPLARY EMBODIMENTS

Figure 1:
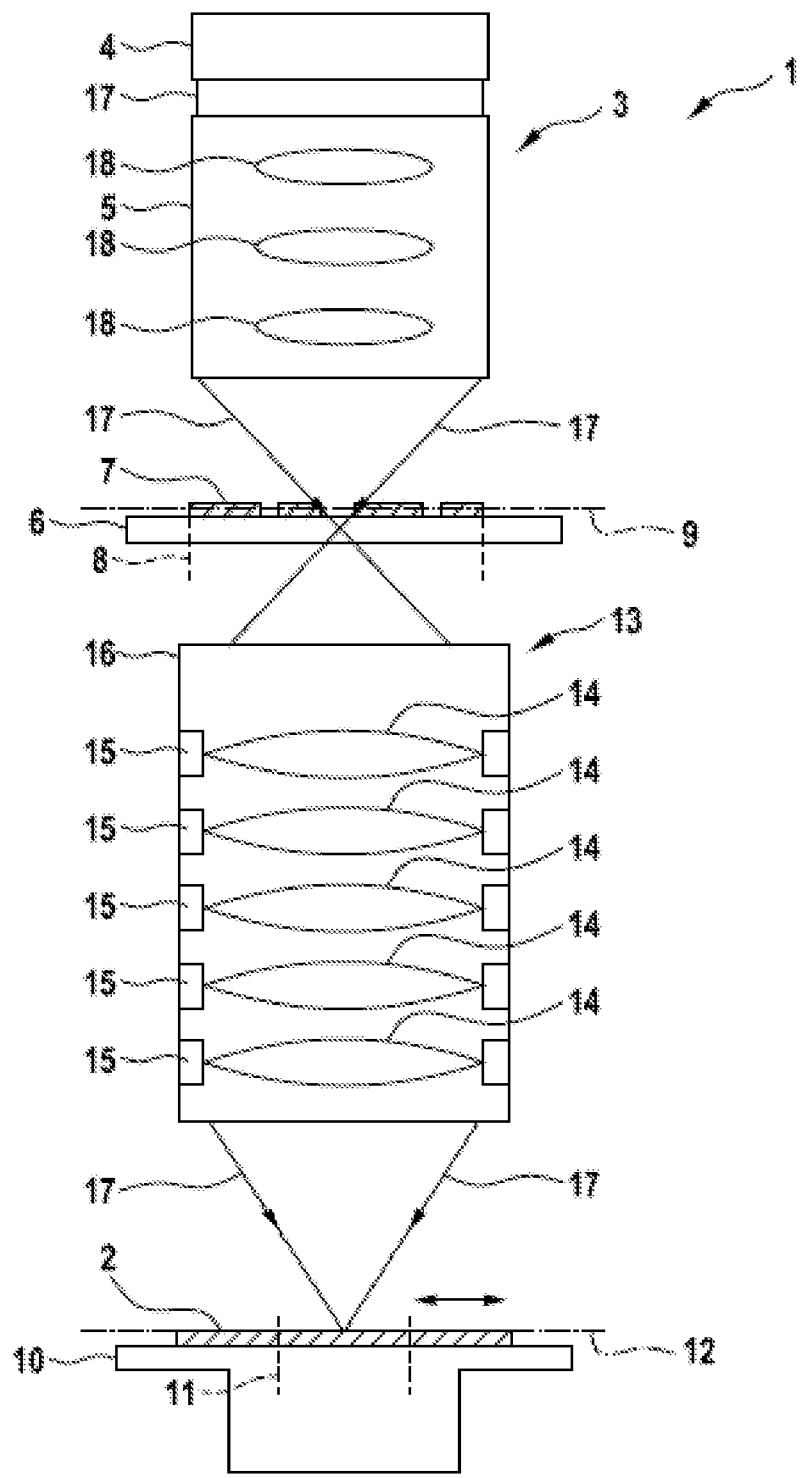
FIG. 1 shows a DUV projection exposure apparatus in which the disclosure can be implemented.

FIG. 1 illustrates an exemplary projection exposure apparatus 1 in which the disclosure can be used. The projection exposure apparatus 1 serves for the exposure of structures on a substrate which is coated with photosensitive materials, and which generally consists predominantly of silicon and is referred to as a wafer 2, for the production of semiconductor components, such as computer chips.

In this case, the projection exposure apparatus 1 substantially comprises an illumination device 3 for illuminating an object field 8 in an object plane 9, a reticle holder 6 for receiving and exactly positioning a mask provided with a structure and arranged in the object plane 9, the mask being a so-called reticle 7, which is used to determine the structures on the wafer 2, a wafer holder 10 for mounting, moving and exactly positioning precisely the wafer 2, and an imaging device, namely a projection optical unit 13, having a plurality of optical elements 14, which are held by way of mounts 15 in a lens housing 16 of the projection optical unit 13.

This provides for the structures introduced into the reticle 7 to be imaged on the wafer 2, the imaging generally reducing the scale.

A light source 4 of the illumination device 3 provides a projection beam 17 in the form of electromagnetic radiation, the projection beam being involved for the imaging of the reticle 7 arranged in the object plane 9 onto the wafer 2 arranged in the region of an image field 11 in an image plane 12, the electromagnetic radiation being in a wavelength range of between 100 nm and 300 nm, for example. A laser, a plasma source or the like can be used as source 4 for this radiation, also referred to hereinafter as used light. The radiation is shaped via of optical elements 18 in an illumination optical unit 5 of the illumination device 3 in such a way that the projection beam 17, when incident on the reticle 7 arranged in the object plane 9, illuminates the object field 8 with the desired properties with regard to diameter, polarisation, shape of the wavefront and the like.

An image of the reticle 7 is generated by way of the projection beam 17 and, after having been correspondingly reduced by the projection optical unit 13, is transferred to the wafer 2 arranged in the image plane 12, as has already been explained above. In this case, the reticle 7 and the wafer 2 can be moved synchronously, so that regions of the reticle 7 are imaged onto corresponding regions of the wafer 2 virtually continuously during a so-called scanning process. The projection optical unit 13 has a multiplicity of individual refractive, diffractive and/or reflective optical elements 14, such as for example lens elements, mirrors, prisms, terminating plates and the like, wherein the optical elements 14 can be actuated for example via one or a plurality of actuator arrangements, not illustrated separately in the figure.

Figure 2:
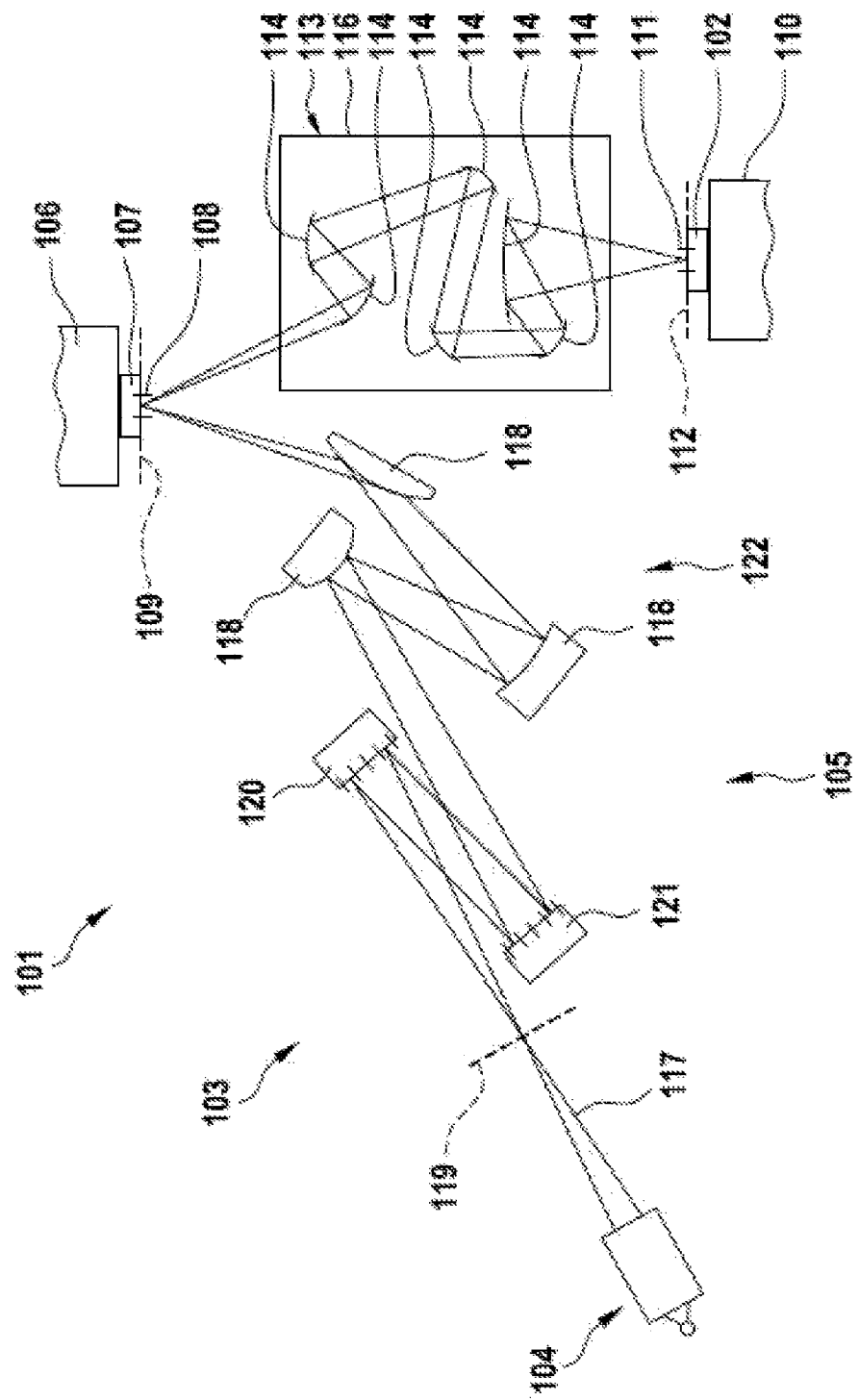
FIG. 2 shows an EUV projection exposure apparatus in which the disclosure can be implemented.

FIG. 2 shows by way of example of a microlithographic EUV projection exposure apparatus 101 in which the disclosure can likewise find application. The construction of the projection exposure apparatus 101 and imaging of a structure on a reticle 107 arranged in the object plane 109 onto a wafer 102 arranged in the image plane 112 are comparable to the construction and procedure described in FIG. 1. Identical component parts are designated by a reference sign increased by 100 relative to FIG. 1, i.e. the reference signs in FIG. 2 begin with 101. In contrast to a transmitted-light apparatus as described in FIG. 1, in the EUV projection exposure apparatus 101 only optical elements 114, 118 embodied as mirrors are used for imaging and/or for illumination on account of the short wavelength of the EUV radiation 117 used as used light in the range of 1 nm to 120 nm, for example of 13.5 nm.

The illumination device 103 of the projection exposure apparatus 101 comprises, besides a light source 104, an illumination optical unit 105 for the illumination of the object field 108 in an object plane 109. The EUV radiation 117 in the form of optical used radiation generated by the light source 104 is aligned via a collector, which is integrated in the light source 104, in such a way that it passes through an intermediate focus in the region of an intermediate focal plane 119 before it is incident on a field facet mirror 120. Downs stream of the field facet mirror 120, the EUV radiation 117 is reflected by a pupil facet mirror 121. With the aid of the pupil facet mirror 121 and an optical assembly 122 having mirrors 118, the field facets of the field facet mirror 120 are imaged into the object field 108. Apart from the use of mirrors 114, the construction of the downstream projection optical unit 113 does not differ in principle from the construction described in FIG. 1 and is therefore not described in further detail.

Figure 3:
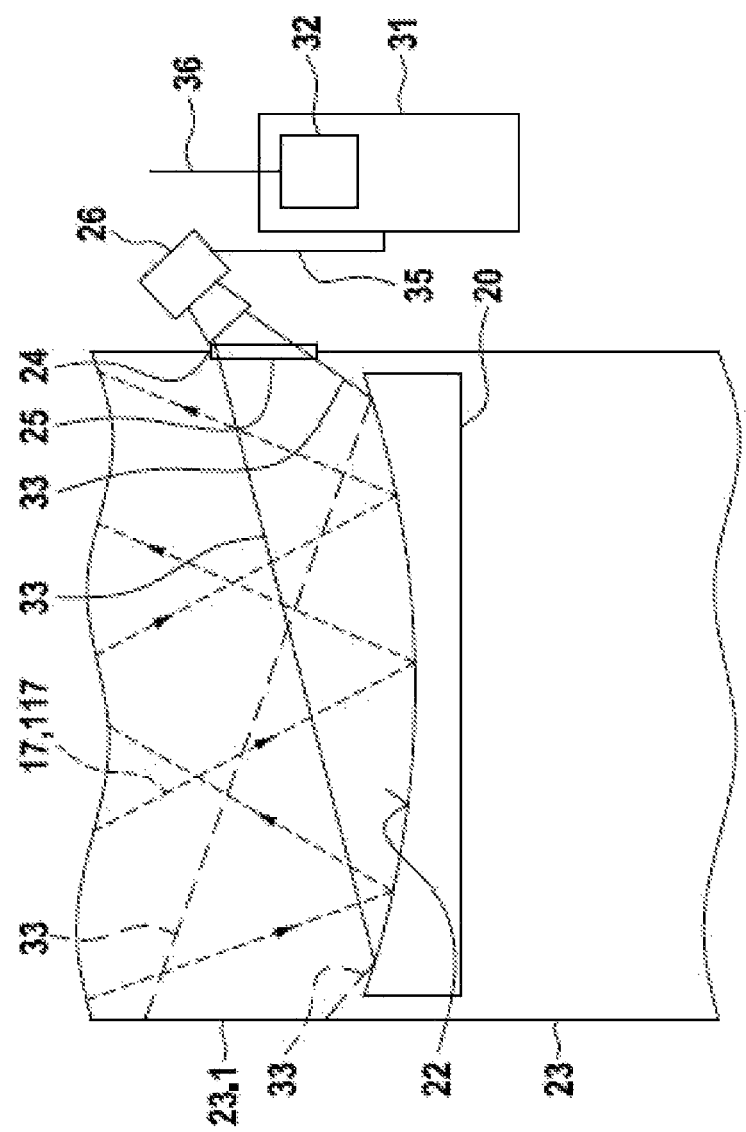
FIG. 3 shows a detail view.

FIG. 3 shows a detail view of a projection exposure apparatus 1, 101 as described in FIG. 1 or FIG. 2, in which an optical element embodied as a mirror 20 and arranged in a housing 23 is illustrated. In the example shown, the housing 23 comprises a cutout 24 closed off by a window 25, thereby avoiding gas exchange with the surroundings through the cutout 24. A temperature recording device embodied as an infrared camera 26 in the example shown detects, through the window 25, partly or completely the optical effective surface 22 irradiated with used light 17, 117 as that part of the surface of the mirror 20 which is under consideration in this case. The window 25 is transmissive to the thermal radiation 33, 34 which is detected by the infrared camera 26 and which is relevant to the temperature determination. In other embodiments of the disclosure, the temperature recording device can also be situated elsewhere, for example also within the housing. A window would not be necessary in this case. The mechanical links of the mirror 20 and of the infrared camera 26 to the housing 23 are not illustrated for reasons of clarity. The illustration likewise does not show one or a plurality of optional temperature sensors in the mirror material, which can be used for calibration purposes, for example. The optical effective surface 22 of the mirror is heated as a result of absorption of used light 17, 117, wherein the temperature on the optical effective surface 22 is not constant on account of the non-constant distribution of the used light 17, 117 on the optical effective surface 22 and different heat flows in the mirror 20. Actuators can compensate for possibly unwanted rigid body movements of the mirror. In order to compensate for the temperature differences by way of the optical effective surface 22 and the deformation effected thereby, the mirror 20 can be temperature-regulated by a temperature-regulating device (not illustrated) and/or can be deformed by actuators (not illustrated), which can be arranged at the rear side of the mirror 20, for example, in such a way that the deformations formed as a result of the heating of the mirror 20 are compensated for. To that end, the surface temperature of the optical effective surface 22 is determined by the infrared camera 26 comprising a filter 30 and a controller 31. The controller 31 is connected to the infrared camera 26 via a line 35, wherein in the case where the mirror 20 is cooled and/or deformed, the temperature-regulating device and/or the actuators are/is likewise connected to the controller 31. The infrared camera 26 sees only the thermal radiation 34 emitted by the mirror 20 and the thermal radiation 33 emitted by a part 23.1 of the housing 23 and reflected by the mirror 20. Depending on the ratio of the thermal radiation 34 originally emitted by the irradiated surface 22, which thermal radiation is relevant to the determination of the temperature of the irradiated surface 22, and the thermal radiation 33 emitted by the part 23.1 of the housing 23 that is detected by way of reflection, the determination of the surface temperature of the optical effective surface 22 can be possible with a sufficient accuracy of below ±0.5° K. In the example shown, the controller 31 comprises a lock-in amplifier 32, which can enable an improved determination of the thermal radiation 34 emitted by the optical effective surface 22 against the background of the thermal radiation 33 emitted by the housing part 23.1. This can make use of the fact that the thermal radiation 34 of the irradiated surface 22 comprises a constant portion and a cyclic portion caused by the cyclic exposure of the mirror 20 during the operation of the projection exposure apparatus. The optical effective surface 22 is irradiated for example with a clocking of 0.2 seconds "light on" and 0.5 seconds "light off". In this example, the bulk material of the mirror 20 would have a temperature of approximately 60° Celsius but the topmost layers of the mirror 20 would have a surface temperature of between e.g. approximately 60° Celsius and e.g. approximately 120° Celsius that changes cyclically over time. This topmost layer is small and its proportion of the total thermal radiation is likewise small as a result; it may correspond for example only to 0.1% of the total thermal radiation of the mirror surface. However, this clocked signature of the thermal radiation 34 can be amplified, detected and determined with the aid of the lock-in technique.

In the case where the lock-in amplifier 32 is used, the controller 31 is connected by a line 36 to the illumination or the illumination controller (neither being illustrated) of the projection exposure apparatus, via which the clocking of the used light 17, 117 is communicated to the controller 31. Furthermore, the ratio of the thermal radiation 34 emitted by the housing part 23.1 and the thermal radiation 34 emitted by the optical effective surface 22 can also be increased via the setting of the emissivities of the housing part 23.1 imaged onto the infrared camera 26 and of the optical effective surface 22 for the wavelength range detected by the infrared camera 26. In this case, the emissivity at least for the imaged part of the housing 23 is reduced and that of the irradiated surface 22 is increased, which will be described below with reference to FIGS. 4, 5 and 6.

Figure 4:
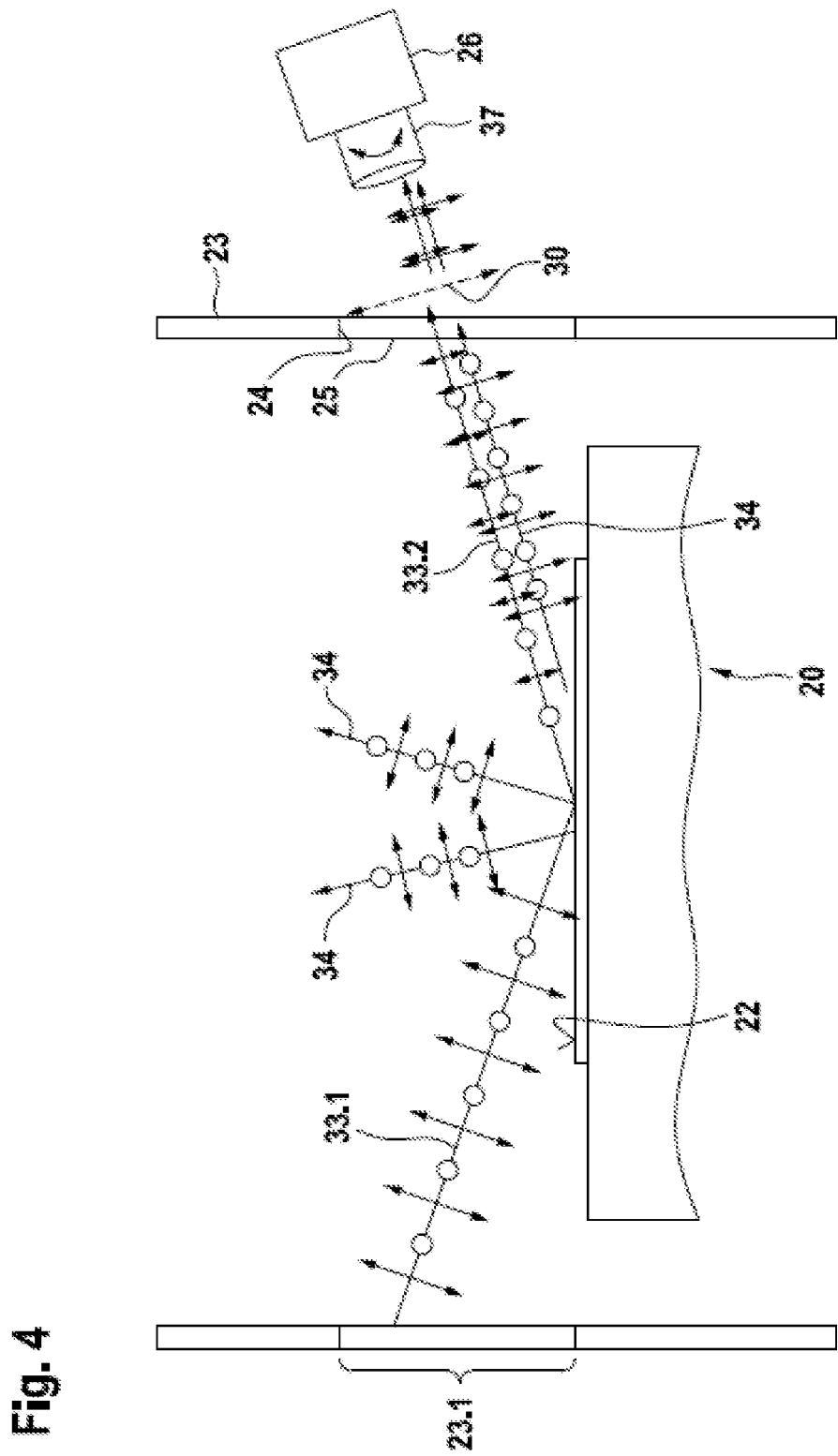
FIG. 4 shows a further detail view.

FIG. 4 shows a detail view of the mirror 20 and of the housing 23. The thermal radiation 33.1 emitted by the housing part 23.1 is initially not polarised. As a result of the reflection at the optical effective surface 22 of the mirror 20, the thermal radiation is polarised primarily perpendicularly for angles of incidence of greater than 0°. The thermal radiation 33.2 arriving at the infrared camera 26, the thermal radiation being emitted by the partial housing 23.1 and reflected at the mirror 20, is thus oriented primarily perpendicular to the plane of incidence of the radiation 33.1 on the mirror 20. This effect can be relatively pronounced for example if the thermal radiation 33.1 is reflected at an angle of reflection close to the Brewster angle. In this context, close should be understood to mean a deviation of the angle of incidence from the Brewster angle of less than 10°. The filter 30 arranged between the mirror 20 and the infrared camera 26 blocks the perpendicular polarisation direction, however, such that only the parallel polarisation direction, that is to say the portions of the thermal radiation 33.2 which are oriented parallel to the plane of incidence, impinge on the infrared camera 26. As a result, the ratio of reflected thermal radiation 33.2 of the housing part 23.1 and the thermal radiation 34 of the mirror 20 is decreased further and the determination of the temperature of the optical effective surface 22 is additionally simplified as a result. The filter 30 can also be embodied as a rotating polarisation filter, whereby a known frequency is impressed on the intensity of the reflected, polarised thermal radiation, the intensity being detected by the IR camera 26. In this way, the signal portion attributed to reflected (and unwanted) radiation is easily identified by the IR camera 26 and taken into account in the determination of the surface temperature of the optical element. A combination of the filter 30 and the lock-in technique is also possible. Furthermore, it is also possible for a plurality of infrared cameras 26 to be directed at the optical effective surface 22 and to detect different regions of the optical effective surface 22. In addition, the infrared camera 26 itself or only an optical unit 37 can be mounted in a movable fashion, such that the optical effective surface 22 can be scanned.

Figure 5:
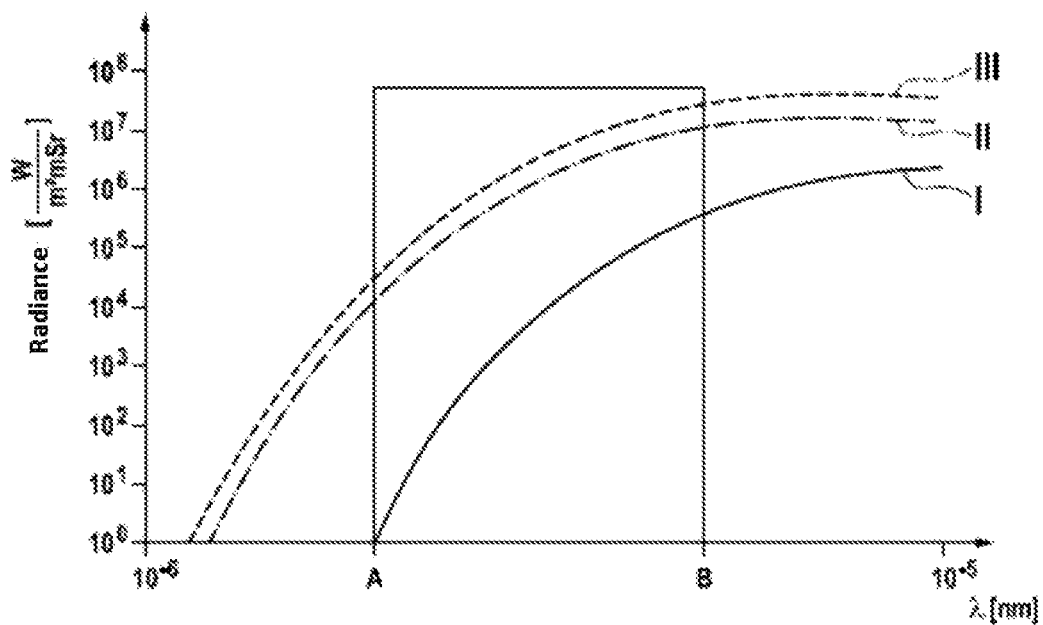
FIG. 5 shows a diagram illustrating radiances versus wavelength.

FIG. 5 shows a diagram in which the spectral radiance in $W/(m^2 mSr)$, referred to hereinafter just as radiance, is plotted against the wavelength in a double logarithmic plot. The wavelength is plotted on the abscissa and the radiance is plotted on the ordinate. The range bounded by the points A and B on the abscissa represents the wavelength range in which the infrared camera detects thermal radiation, which range is between 2 µm and 5 µm in the example shown. Curve I shows the radiance of the housing part 23.1 temperature-regulated to −20 ° Celsius, the housing part being illustrated in FIGS. 3 and 4. Curves II and III show the radiance of an irradiated optical effective surface 22 temperature-regulated to 100° Celsius, the optical effective surface being illustrated in FIGS. 3 and 4. In this case, curve II represents the radiance for an emissivity of 0.4 and curve III represents the radiance for an emissivity of 1.0, that is to say for a black body.

Figure 6:
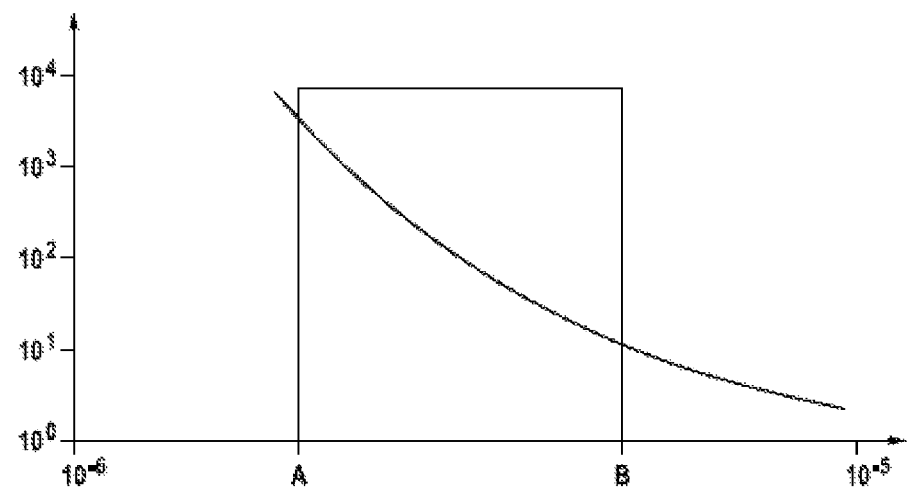
FIG. 6 shows a diagram illustrating the ratio of two radiances versus wavelength.

FIG. 6 shows a diagram in which the ratio of curves I and II illustrated in FIG. 5 is plotted likewise in a double logarithmic plot. The wavelength is again plotted on the abscissa and the ratio of the radiances is plotted on the ordinate. In the range of the wavelengths detected by the infrared camera, the ratio is between 12 and 1500. Even if the emissivity for the optical effective surface 22 is around values of 0.05, such as are customary in the case of non-optimised coatings, the ratio of the radiances of optical effective surface 22 and housing part 23.1 is still more than 450, which is sufficient for determining the surface temperature of the irradiated surface with an accuracy of ±1° K.

LIST OF REFERENCE SIGNS

1 DUV projection exposure apparatus
2 Wafer
3 Illumination device
4 Light source
5 Illumination optical unit
6 Reticle holder
7 Reticle
8 Object field
9 Object plane
10 Wafer holder
11 Image field
12 Image plane
13 Projection optical unit
14 Optical elements (projection optical unit)
15 Mounts
16 Lens housing
17 Projection beam
18 Optical elements (illumination device)
20 Mirror
22 Optical effective surface/surface
23, 23.1 Housing/imaged housing part
24 Cutout
25 Window
26 Temperature recording device, infrared camera
30 Filter
    31 Controller
32 Lock-in amplifier
33 Thermal radiation of housing
34 Thermal radiation of optical effective surface
35 IR camera/controller line
36 Illumination/controller line
37 Optical unit of infrared camera 101 EUV projection exposure apparatus
102 Wafer
103 Illumination device
104 Light source
105 Illumination optical unit
106 Reticle holder
107 Reticle
108 Object field
109 Object plane
110 Wafer holder
111 Image field
112 Image plane
113 Projection optical unit
114 Optical elements (projection optical unit)
115 Mounts
116 Lens housing
117 Projection beam
118 Optical elements (illumination device)
119 Intermediate focus
120 Field facet mirror
121 Pupil facet mirror
122 Optical assembly
I Radiance of housing part
II Radiance of mirror epsilon=0.4
III Radiance of mirror epsilon=1
IV Radiance ratio of mirror to housing part
A Lower limit of wavelength range of IR camera
B Upper limit of wavelength range of IR camera

What is claimed is:

1. An apparatus, comprising:
a housing comprising a part;
an optical element comprising an optical effective surface;
a polarisation filter; and
a temperature recording device,
wherein:
the apparatus is configured so that, during use of the apparatus: i) unpolarized electromagnetic radiation emitted by the part of the housing is incident on the optical element in a plane of incidence and reflected from the optical element to provide reflected electromagnetic radiation that is polarized perpendicular to the plane of incidence; ii) the reflected electromagnetic radiation is blocked by the polarisation filter from reaching the temperature recording device; iii) unpolarized electromagnetic radiation comprising components polarized parallel to the plane of incidence emanate from the optical effective surface due to a temperature of the optical element; iv) at least some of the components of the electromagnetic radiation polarized parallel to the incidence plane pass through the polarisation filter and impinge on the temperature recording device; and v) the temperature recording device determines the temperature of the optical effective surface based only on the electromagnetic radiation polarized parallel to the plane of incidence that impinges on the temperature recording device; and
the apparatus is a projection exposure apparatus for semiconductor lithography.

2. The apparatus of claim 1, wherein the apparatus is configured so that, during use of the apparatus, the reflected electromagnetic radiation emanates from the optical effective surface at an angle that is within 10° of the Brewster angle.

3. The apparatus of claim 2, wherein the polarisation filter comprises a rotating polarisation filter.

4. The apparatus of claim 1, wherein the polarisation filter comprises a rotating polarisation filter.

5. The apparatus of claim 1, wherein the optical effective surface of the optical element comprises a coating having an emissivity of greater than 0.1 for a wavelength range of the electromagnetic radiation detected by the temperature recording device.

6. The apparatus of claim 1, wherein the optical effective surface of the optical element comprises a coating having an emissivity of greater than 0.4 for a wavelength range of the electromagnetic radiation detected by the temperature recording device.

7. The apparatus of claim 1, wherein the optical effective surface of the optical element comprises a coating having an emissivity of greater than 0.95 for a wavelength range of the electromagnetic radiation detected by the temperature recording device.

8. The apparatus of claim 1, wherein the temperature recording device comprises an IR camera.

9. The apparatus of claim 1, wherein the temperature recording device is configured to detect the electromagnetic radiation emanating from a partial region of the optical effective surface of the optical element.

10. The apparatus of claim 1, wherein the temperature recording device is configured to detect electromagnetic radiation emanating from the optical element in a scanning fashion.

11. The apparatus of claim 1, wherein the temperature recording device is movable to detect electromagnetic radiation emanating from the optical element in a scanning fashion.

12. The apparatus of claim 1, wherein the temperature recording device comprises a movable optical unit to detect electromagnetic radiation emanating from the optical element in a scanning fashion.

13. The apparatus of claim 1, wherein:
the optical effective surface of the optical element has a first emissivity for a wavelength range of the electromagnetic radiation detected by the temperature recording device;
the part of the housing has a second emissivity for the wavelength radiation; and
the first emissivity is greater than the second emissivity.

14. The apparatus of claim 13, wherein the optical element comprises a coating, and the coating has the first emissivity.

15. An apparatus, comprising:
a housing comprising a part;
an optical element comprising an optical effective surface;
a rotatable polarization filter;
a lock-in amplifier; and
a temperature recording device,
wherein:
the apparatus is configured so that during use of the apparatus: i) electromagnetic radiation is emitted by the part and reflected from the optical effective surface to provide a first portion of electromagnetic radiation; ii) electromagnetic radiation is emitted from the optical effective surface due to a temperature of the optical effective surface to provide a second portion of electromagnetic radiation; iii) the polarization filter has a first position in which the first portion and at least parts of the second portion of electromagnetic radiation pass through the filter and reach the temperature recording device; iv) the polarization filter has a second position in which the filter blocks the first portion of electromagnetic radiation from reaching the temperature recording device and at least parts of the second radiation pass the polarization filter; v) the lock-in amplifier controls rotation of the filter so that the temperature recording device distinguishes the first portion of electromagnetic radiation from the second portion of electromagnetic radiation; and vi) the temperature recording device determines the temperature of the optical effective surface based only on the second portion of the electromagnetic radiation; and the apparatus is a projection exposure apparatus for semiconductor lithography.

16. The apparatus of claim 15, wherein:

the optical effective surface of the optical element has a first emissivity for a wavelength range of the electromagnetic radiation detected by the temperature recording device;

the part of the housing has a second emissivity for the wavelength radiation; and the first emissivity is greater than the second emissivity.

17. The apparatus of claim 16, wherein the optical element comprises a coating, and the coating has the first emissivity.

18. The apparatus of claim 15, wherein the optical effective surface of the optical element comprises a coating having an emissivity of greater than 0.1 for a wavelength range of the electromagnetic radiation detected by the temperature recording device.

19. The apparatus of claim 15, wherein the temperature recording device comprises an IR camera.

20. The apparatus of claim 15, wherein the temperature recording device is configured to detect electromagnetic radiation emanating from the optical element in a scanning fashion.

* * * * *

UNITED STATES PATENT AND TRADEMARK OFFICE
CERTIFICATE OF CORRECTION

| | |
|---|---|
| PATENT NO. | : 12,321,105 B2 |
| APPLICATION NO. | : 17/932423 |
| DATED | : June 3, 2025 |
| INVENTOR(S) | : Timo Laufer and Michael Stolz |

It is certified that error appears in the above-identified patent and that said Letters Patent is hereby corrected as shown below:

In the Specification

Column 5, Line 64, delete "Downs stream" and insert -- Downstream --.

Column 8, Line 13, delete "-20 °" and insert -- -20° --.

Signed and Sealed this
Twenty-first Day of October, 2025

John A. Squires
*Director of the United States Patent and Trademark Office*